(12) United States Patent
Nikola et al.

(10) Patent No.: US 10,076,052 B2
(45) Date of Patent: Sep. 11, 2018

(54) ELECTRICAL DEVICE AND METHOD FOR PRODUCING AN ELECTRICAL DEVICE

(71) Applicant: SEW-EURODRIVE GMBH & CO. KG, Bruchsal (DE)

(72) Inventors: Joachim Nikola, Karaichtal (DE); Hans Jürgen Kollar, Bruchsal (DE); Dirk Momann, Bruchsal (DE)

(73) Assignee: SEW-EURODRIVE GmbH & Co. KG, Bruchsal (DE)

( * ) Notice: Subject to any disclaimer, the term of this patent is extended or adjusted under 35 U.S.C. 154(b) by 0 days.

(21) Appl. No.: 15/301,687

(22) PCT Filed: Mar. 6, 2015

(86) PCT No.: PCT/EP2015/000502
§ 371 (c)(1),
(2) Date: Oct. 3, 2016

(87) PCT Pub. No.: WO2015/149907
PCT Pub. Date: Oct. 8, 2015

(65) Prior Publication Data
US 2017/0118857 A1   Apr. 27, 2017

(30) Foreign Application Priority Data
Apr. 3, 2014 (DE) .................. 10 2014 004 799

(51) Int. Cl.
*H02K 11/33* (2016.01)
*H02P 27/06* (2006.01)
(Continued)

(52) U.S. Cl.
CPC .............. *H05K 7/142* (2013.01); *H05K 1/182* (2013.01); *H05K 5/0069* (2013.01);
(Continued)

(58) Field of Classification Search
CPC .............. H05K 7/14; H05K 1/18; H05K 5/00
(Continued)

(56) References Cited

U.S. PATENT DOCUMENTS 4,254,301 A * 3/1981 Serino ................... H05K 7/12
174/138 G
5,008,777 A * 4/1991 Burns .................... H05K 1/141
174/138 G
(Continued)

FOREIGN PATENT DOCUMENTS

| DE | 10 2007 012 818 | 1/2008 |
| DE | 10 2008 031 296 | 8/2009 |
| DE | 10 2012 005 622 | 9/2013 |

OTHER PUBLICATIONS

International Search Report, dated Jun. 15, 2015, issued in corresponding International Application No. PCT/EP2015/000502.
(Continued)

*Primary Examiner* — Michael F McAllister
(74) *Attorney, Agent, or Firm* — Hunton Andrews Kurth LLP (57) ABSTRACT

In an electrical device, in particular a converter, and a method for producing an electrical device having a circuit board and a housing part, a connecting part is fitted into the circuit board, in particular by soldering. The connecting part has a spacer section and a connection element. The circuit board is separated from the housing part with the aid of the spacer section. The connection element has a threaded segment. The connection element may be connected to at least one circuit trace on the circuit board in an electrically conductive manner.

19 Claims, 4 Drawing Sheets

(51) Int. Cl.
*H05K 7/14* (2006.01)
*H05K 5/00* (2006.01)
*H05K 1/18* (2006.01)

(52) U.S. Cl.
CPC ........... *H05K 7/1432* (2013.01); *H02K 11/33* (2016.01); *H02P 27/06* (2013.01); *H05K 2201/10015* (2013.01)

(58) Field of Classification Search
USPC ........................................................ 361/752
See application file for complete search history.

(56) References Cited

U.S. PATENT DOCUMENTS

| | | | | |
|---|---|---|---|---|
| 5,786,989 | A * | 7/1998 | Kawabe | H05K 1/181 174/138 G |
| 6,186,800 | B1 * | 2/2001 | Klein | H01R 4/64 174/51 |
| 6,863,562 | B1 * | 3/2005 | Jensen | H01R 13/73 174/138 G |
| 7,541,670 | B2 | 6/2009 | Matsumoto | |
| 7,667,299 | B2 * | 2/2010 | Mori | H05K 1/023 257/19 |
| 9,035,193 | B2 * | 5/2015 | Kagimura | H05K 1/0263 174/251 |
| 2009/0251843 | A1 | 10/2009 | Hironaka | |
| 2010/0091464 | A1 | 4/2010 | Ohnishi et al. | |
| 2010/0254105 | A1 * | 10/2010 | Lu | H05K 7/1417 361/759 |
| 2013/0265737 | A1 | 10/2013 | Bugaris et al. | |
| 2013/0308257 | A1 | 11/2013 | Kosugi et al. | |
| 2015/0103570 | A1 | 4/2015 | Marahrens | |
| 2016/0254105 | A1 * | 9/2016 | Holzwarth | H01G 11/26 216/6 |
| 2016/0294301 | A1 * | 10/2016 | Yokoyama | H02M 7/003 |

OTHER PUBLICATIONS

International Preliminary Report on Patentability, dated Oct. 20, 2016, issued in corresponding International Application No. PCT/EP2015/000502.
Australian Examination Report issued in corresponding Application No. 2015240092, dated Jun. 8, 2018.

\* cited by examiner

ELECTRICAL DEVICE AND METHOD FOR PRODUCING AN ELECTRICAL DEVICE

FIELD OF THE INVENTION

The present invention relates to an electrical device and to a method for producing an electrical device.

BACKGROUND INFORMATION

A circuit configuration for a converter having a filter system is described in German Published Patent Application No. 10 2012 005 622.

SUMMARY

Example embodiments of the present invention provide an electrical device and a method for producing an electrical device, in which safety is improved.

According to an example embodiment of the present invention, an electrical device, in particular a converter, includes a circuit board and a housing part.

A connecting part is inserted into the circuit board, in particular by soldering.

The connecting part includes a spacer section and a connection element.

The circuit board is separated from the housing part by the spacer section.

The connection element includes a threaded segment.

The connection element may be connected in an electrically conductive manner to at least one circuit trace on the circuit board.

This is considered advantageous in that the connecting part can be securely connected to the circuit board.

The connecting part can be inserted into the circuit board in the same working step as other components; in a further working step, it may be connected to the circuit board together with the other components in a soldering operation. This is better for the environment.

The circuit board and the electrical components inserted into the circuit board are able to be separated from the housing part with the aid of the spacer section. This improves the dielectric strength of the electrical device, and arc-overs from the electrical components to the housing part are avoidable.

The connecting part may be arranged as a composite component. The connection element is produced from an electrically conductive material, in particular from metal, and the spacer section is produced from an electrically insulating material, in particular from plastic. This is considered advantageous in that the connecting part can easily be soldered to the circuit board with the aid of the connection element. Using the electrically insulated spacer section, the circuit board and electrical components inserted into the circuit board are able to be separated from the housing part. A clearance can therefore be specified between the circuit board provided with the electrical components and the housing part, which improves the safety of the electrical device.

The spacer section may be arranged as a plastic injection-molded part, so that the spacer section is advantageously able to be produced in a simple and cost-effective manner.

The spacer section may be extruded onto the connection element, which is considered advantageous because the spacer section can easily and securely be connected to the connection element. The spacer section may be produced and connected to the connection element in a single working step.

The connection element may be at least partially covered by the spacer section. This is considered advantageous in that the spacer section wraps around the connection element at least partially, so that the connection of the spacer section to the connection element can be carried out in a mechanically stable and reliable manner.

The spacer section may wrap around an edge of the connection element, in particular a sheet metal edge. This is considered advantageous insofar as the spacer section surrounds the edge of the connection element at least partially and thus improves the mechanical stability and security of the connection between the spacer section and the connection element.

Electrical components may be inserted into the circuit board and the spacer section may be situated between the circuit board and the housing part such that the electrical components on the circuit board have a minimum clearance with respect to the housing part. This is considered advantageous in that it improves the dielectric strength of the electrical device, which also improves the safety of the electrical device.

The gap between the electrical components and the housing part, i.e. the clearance, may be greater than 5 mm. This offers the advantage that the breakdown voltage of the electrical device is greater than 10 kV, making it possible to safely operate the electrical device even at high operating voltages.

The connection element may include at least one connection section, i.e. in particular a connection tab, as well as at least one support section and the threaded segment. This advantageously provides for a compact construction of the connection element.

The connection element may be produced as one piece, which is considered advantageous insofar as it allows the connection element to be produced in a cost-effective manner. Components can be saved in this manner, which is better for the environment.

The connection element may be produced as a stamped-bent part, in particular as a stamped-bent sheet metal part, which advantageously makes it possible to produce the connection element in an uncomplicated manner.

A connection section, or the connection section, may project through a bore in the circuit board and is soldered to a circuit trace of the circuit board. This is considered advantageous in that the connecting part can be soldered to the circuit board in the same working step used for inserting the electrical components into the circuit board.

The perpendicular projection of the support section onto the circuit board plane may surround the perpendicular projection of the bore onto the circuit board plane at an angle of more than 180 degrees, in particular more than 230 degrees, in the circumferential direction of the projection of the bore. This is considered advantageous insofar as the connecting part can be inserted into the circuit board without the risk of tilting. This improves the safety during the soldering of the connection element because the connection section or sections is/are securely situated inside the bore(s), which therefore reduces the chance of soldering faults.

The support section may extend at a right angle to a normal vector of the circuit board plane of the circuit board. This is considered advantageous insofar as the connecting part can be inserted into the circuit board without any risk of tilting. The connecting part has a large surface that faces the circuit board. The surface of the support section pointing toward the circuit board advantageously amounts to at least 30% of the total surface of the support section, in particular 40%.

Breakaway of the connecting part, which is soldered to the circuit board, is able to be prevented.

The housing part may include stamped recesses, which extend through the housing part. A screw part can be slipped through one of the recesses, and/or the threaded segment is situated in alignment with the recess, the screw part making it possible to connect the housing part and the connection element in an electrically conductive manner. This is considered advantageous in that electrical components on the circuit board can be connected to the earth potential via the screw part, so that an optional connection to the earth potential is able to be provided.

The electrical device may be adaptable to different applications that require different low-voltage networks for the electric current supply. In an IT system that is arranged as an ungrounded network, the electrical device is used without a screw part since the electrical components on the circuit board must be insulated from the grounded housing part. IT-systems are used in small networks that have a limited extension and make high demands on a fail-safe operation, such as in hospitals. Additional safety precautions for personal protection are required, for instance, insulation monitoring devices, overvoltage protective devices, fault current protective systems and/or fault voltage protective systems.

In low-voltage networks having a neutral conductor, such as TN systems or TT systems, the electrical components are partially connected to the earth potential. This makes it easier to detect fault currents than in an IT system, for instance with the aid of fault current circuit breakers. The low voltage networks featuring a neutral conductor may therefore have a much larger size than the IT system.

The recess for the screw part can advantageously be produced in the same working step as the further recesses, such as the ventilation holes.

The electrical components are advantageously connectable to the grounded housing part by the screw part, which makes it possible to use the electrical device both for networks provided with a neutral conductor and for networks without a neutral conductor. The adaptation to the particular network is easily accomplished by screwing the screw part into the connecting part or by unscrewing and removing the screw part.

The housing part may act as the ground connection. This has the advantage that the electrical device is able to be provided in a compact manner, which makes it possible to save components and to better protect the environment.

A screw part may be guided through a recess in the housing part and screwed into the threaded segment. This screw connection is self-locking, in particular, and the screw part connects the housing part and the connection element in an electrically conductive manner. This is considered advantageous in that the electrically conductive connection between the housing part and the connection element is easy to establish. This connection can be implemented in a safe manner, and the screw is able to be connected in a vibration-proof manner.

A perforated disk may be situated between a screw head of the screw part and the housing part. This is considered advantageous insofar as the support surface between the screw part and the housing part can be enlarged, so that the electric conductivity is improved.

The spacer section may have a recess, through which the screw part can be guided, or through which the screw part is guided, in particular. This is considered advantageous in that the spacer section can be clamped between the housing part and the connection element. The contact pressure of the screw part is able to be uniformly distributed to the spacer section that partially surrounds the screw part.

The elastic spacer section may function as a mechanical damping device against vibrations of the housing part. This dampens the vibrations of the housing part, and the circuit board is located inside the housing in a vibration-damped manner.

The recess may extend through the spacer section, which is considered advantageous in that the screw part can be guided through the spacer section.

The spacer section may be substantially U-shaped, and a region of the screw part can be situated or, in particular, is situated, between the legs of the U. This advantageously saves material, and the environment is protected in a more optimal manner.

First capacitors may be inserted into the circuit board. The first capacitors have a shared star point, which is connected to the connection element of the connecting part in an electrically conductive manner, in particular by way of circuit traces. This has the advantage that fault currents of the first capacitors can be shunted via the connecting part, which therefore provides a safer electrical device.

The star point may be grounded by the connecting part. This has the advantage that the grounding can be carried out easily and in a stable and safe manner.

First capacitors may be inserted into the circuit board; the first capacitors have a shared star point, which is connected to a fourth capacitor in an electrically conductive manner. The fourth capacitor is connected to the connection element of the connecting part, especially by at least one circuit trace of the circuit board; the fourth capacitor is electrically situated between the start point and the connecting part, and a series connection is formed by the star point, the fourth capacitance and the connecting part, in particular. This has the advantage that the fourth capacitor functions as an additional filter, with the aid of which high frequency interference currents are able to be dissipated. This improves the voltage stability and thereby improves the safety of the electrical device.

The fourth capacitor may be grounded with the aid of the connecting part. This has the advantage that interference currents are able to be shunted to the earth potential, which improves the safety of the electrical device.

Second capacitors, which form a series connection having a center tap, may be inserted into the circuit board, the center tap in particular being connected to the star point in an electrically conductive manner. This is considered advantageous insofar as a high-frequency potential reference is able to be established between an alternative voltage segment and a direct voltage segment of the circuit. This potential reference may be utilized for suppressing potential jumps between the alternating voltage segment and the direct voltage segment of the circuit, which result from the switching pattern of the electrical device.

The second capacitors may be switched in parallel with a third capacitor, in particular an intermediate circuit capacitor of the converter. This has the advantage that a high-frequency potential reference can be established between the intermediate circuit and the alternating voltage segment of the converter. As a result, the ground connection via the housing part is able to be unloaded.

The electric drive may have a multi-phase alternating voltage terminal on the input side, which provides a separate connection for each phase. The alternating voltage terminal supplies a rectifier, and an individual connection is connected to an input pole of the rectifier via a separate phase line in each case. Each phase line has a tap, and a first capacitor is electrically situated between each tap and the star point. This has the advantage that the first capacitors serve as a filter system for the electrical device. High frequency fault currents are able to be shunted to the star point with the aid of the first capacitors, thereby improving the safety.

The electrical device may have an inverter; and a voltage source DC link including the third capacitor as intermediate circuit condenser may be situated between the rectifier and the inverter, the inverter being supplied from the third capacitor, in particular. This has the advantage that the electrical device is able to be arranged as a converter. The converter can be used for supplying an electric motor, whose rotational frequency is adjustable with the aid of the converter.

A first inductor may be situated in each phase line between the individual connection and the tap for the particular first capacitor. This has the advantage that the first capacitors and the first inductors form a line filter for the electrical device. This improves the safety of the electrical device.

A separate second inductor may be situated in each phase line between the individual tap for the first capacitor and the particular input pole of the rectifier. This is considered advantageous insofar as the first capacitors form a line filter for the electrical device together with the second inductors. This improves the safety of the electrical device.

According to an example embodiment of the present invention, in a method for producing an electrical device and/or an electrical device model line that includes at least two variants of electrical devices: optionally, a first or a second variant is produced, in a first method step, a circuit board is fitted with at least one connecting part and condensers, the condensers have a shared star point, to which the connecting part is connected in an electrically conductive manner, in particular, and in a second method step, the circuit board is placed in a grounded housing having a housing part, the star point is electrically insulated from the grounded housing during the production of the first variant, and in an optional third method step for producing the second variant, the star point is connected to the grounded housing in an electrically conductive manner in that a connection, in particular a screw part, is guided through a recess in the housing part and reversibly connected to the connecting part.

This has the advantage that the electrical device can be easily adapted to the operation in ungrounded low-voltage networks or in low-voltage networks featuring a neutral conductor.

The connection of electrical components to the grounded housing part can advantageously be implemented in the form of a reversible connection. The electrical device is therefore able to be retroactively converted for the operation in low-voltage networks of a different type.

The screw part may be screwed into the connecting part in the third method step. This has the advantage that the screw part can easily be connected to the connecting part and also disconnected therefrom. The screw connection can advantageously be implemented as self-locking, so that the screw part is able to be connected to the connecting part in a vibration-proof manner.

The screw part may be connected to the grounded housing part in an electrically conductive manner, and the screw part, in particular, may touch the housing part. This has the advantage that the screw part functions as an electrical connection means. The screw part may have a lower electrical resistance than cable connections, so that a low-resistance connection of the grounded housing part to the connecting part is possible. The safety is improved as a result.

Example embodiments of the present invention are explained in greater detail below with reference to the Figures.

DETAILED DESCRIPTION

Figure 1:
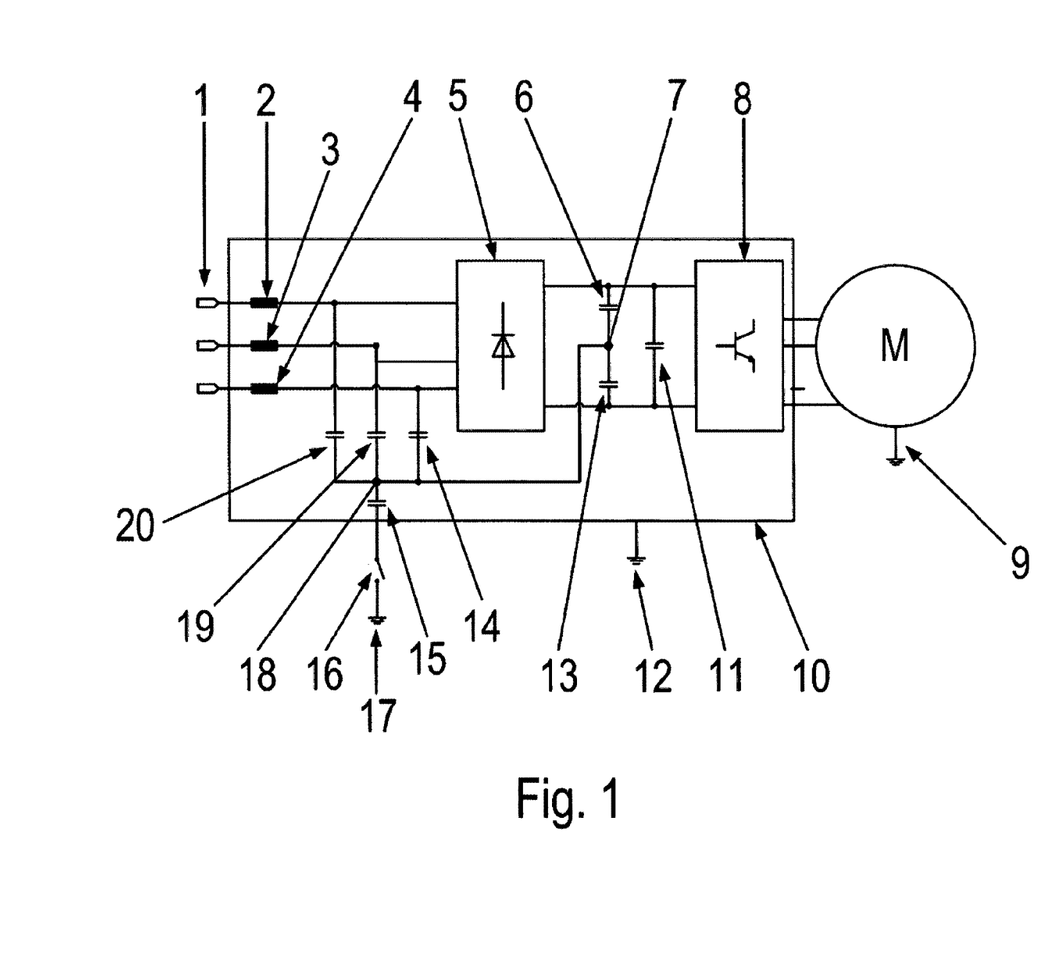
FIG. 1 shows a schematic basic circuit diagram of an electrical device according to an example embodiment of the present invention.

The basic circuit diagram illustrated in FIG. 1 shows the electrical device, preferably a converter, which is provided with a three-phase alternating voltage terminal 1, a rectifier 5, and an inverter 8. Alternating voltage terminal 1 includes three connections, and an individual inductor (2, 3, 4) is connected in series with each connection.

Rectifier 5 has input poles, which are allocated to the individual phases of the alternating current.

Each phase has a phase line between the connection of alternating voltage terminal 1 and the input poles of rectifier 5.

Between individual inductors (2, 3, 4) and rectifier 5, each phase has a branch-off, which is connected to a first capacitor (14, 19, 20) in each case. The capacitors (14, 19, 20) are connected to a shared star point 18. Using an interposed connection 16, star point 18 is able to be connected to a ground connection. A fourth capacitor 15 is situated between connection 16 and star point 18.

A series connection of second capacitors (6, 13), which is switched in parallel with a third capacitor 11, is situated in the voltage intermediate circuit between rectifier 5 and inverter 8. A center tap 7 connected to star point 18 is located between the second capacitors (6, 13).

Second capacitors (6, 13) and third capacitor 11 are thus situated in the constant-voltage DC link. Third capacitor 11 is also referred to as intermediate circuit condenser.

The components of the converter are situated inside a housing 10. Housing 10 is arranged to be at least partially electrically conductive and is preferably made from a metallic material. Housing 10 is connected to an earth connection 12 in an electrically conductive manner and is therefore grounded.

On the output side, inverter 8 is connected to a consumer, preferably a motor M. The consumer has a housing, which is electrically conductively connected to a ground connection 9, which means that the housing of the consumer is grounded.

Figure 2:
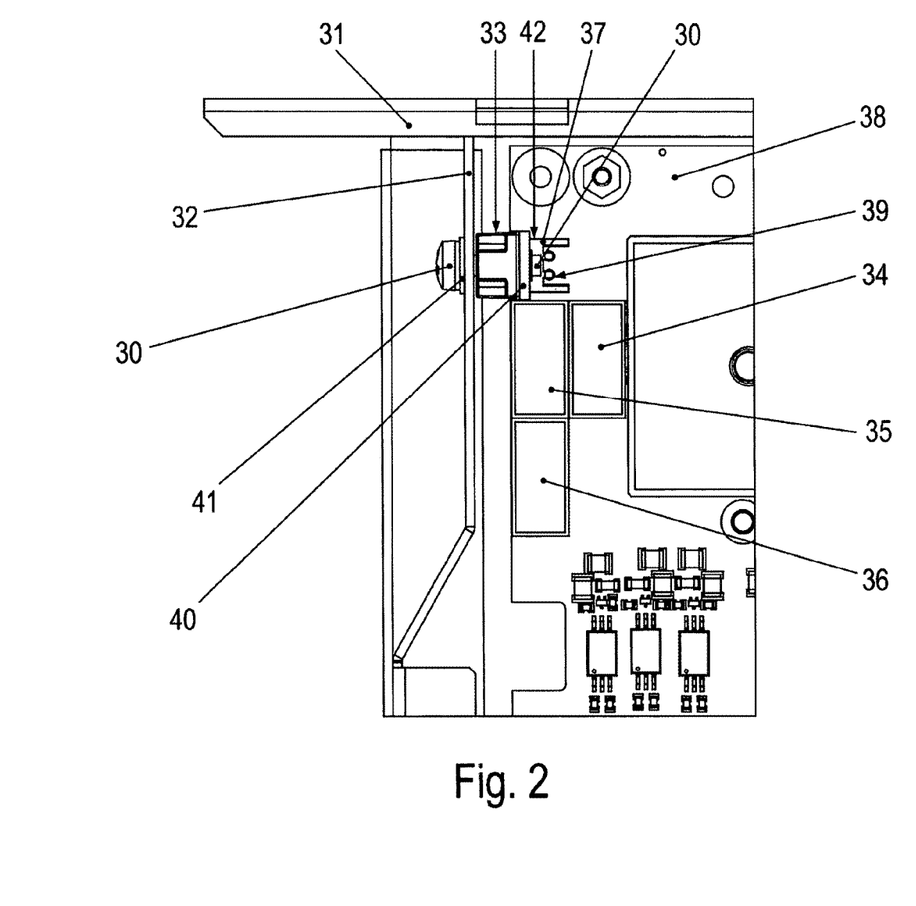
FIG. 2 shows a detail of an electrical device according to an example embodiment of the present invention in a second variant, in a plan view.
Figure 4:
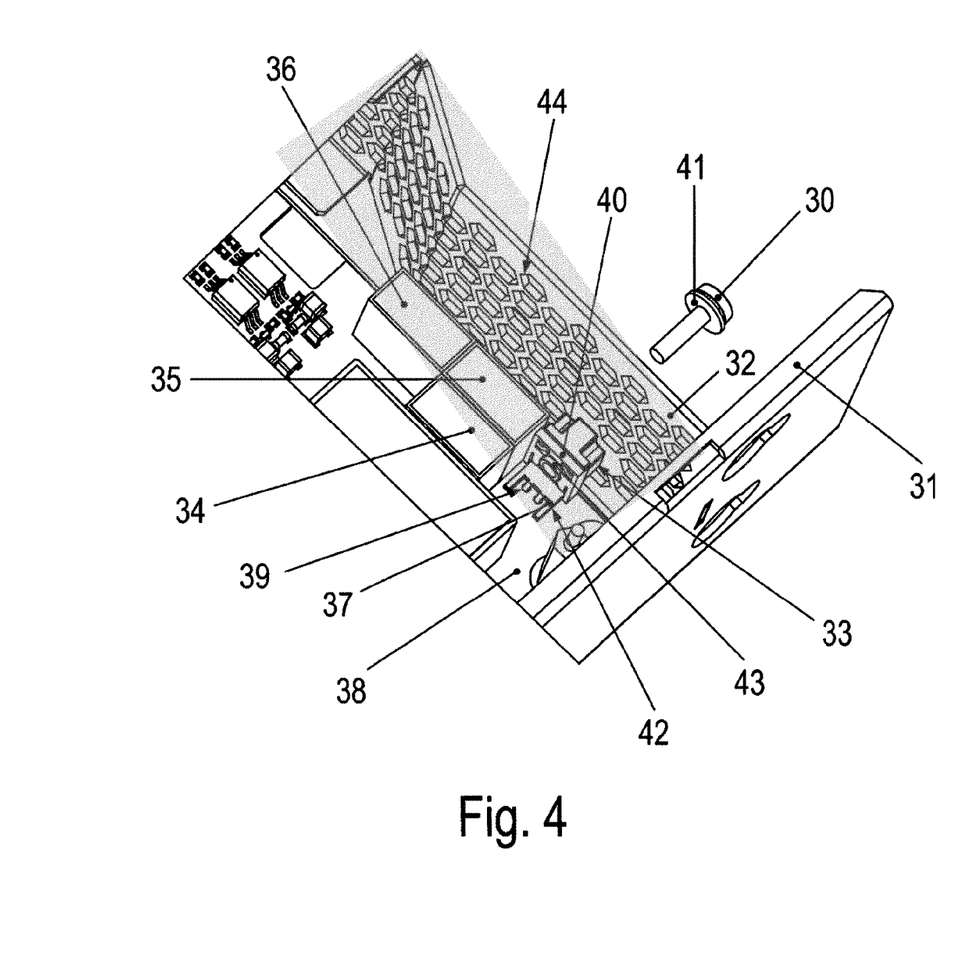
FIG. 4 shows a detail view of the electrical device of the second variant, in an oblique view, in which a screw part is shown in exploded form.

FIGS. 2 and 4 show a detail view of the second variant of the converter. A circuit board 38 of the converter is fitted with condensers (34, 35, 36), which act as capacitors (14, 15, 19, 20).

Circuit board 38 with inserted components is situated inside a housing, which is made up of at least two housing parts (31, 32). Housing part 32 has at least one recess, in particular a bore, through which a screw part 30 is guided. A perforated disk 41 is preferably situated on screw part 30 between housing part 32 and a screw head of screw part 30.

Housing part 32 includes additional recesses 44 for ventilating the converter, that is, ventilation holes, in particular. These recesses 44 are at least partially situated in one plane with the recess for screw part 30.

Housing part 32 is preferably produced as a stamped-bent part, so that the recess for screw part 30 and recesses 40 for the ventilation can be produced in one working step. In other words, recesses 44 are able to be die cut.

A connecting part 40 for linking at least one circuit trace, connected to condensers (34, 35, 36), to housing part 32 in an electrically conductive manner is inserted into circuit board 38. Connecting part 40 thus includes at least one connection section 39, which is plugged into a bore in circuit board 38, is connected by soldering, and/or is connected to the circuit trace in an electrically conductive manner. Connecting part 40 preferably has two connection sections 39.

Screw part 30, which is guided through housing part 32, is connected to connecting part 40, in particular likewise in an electrically conductive manner. Connecting part 40 includes a threaded segment 43 for this purpose, into which screw part 30 is screwed.

Connecting part 40 has a support section 37, which extends at a right angle to the normal vector of the circuit board plane of circuit board 38, from an edge region of circuit board 38 into circuit board 38. Support section 37 is preferably provided in a U-shape, and connection section 39 is preferably situated between the legs of U-shaped support section 37 and extends from support section 37.

The perpendicular projection of support section 37 onto the circuit board plane surrounds the perpendicular projection of the bore onto the circuit board plane at an angle of more than 180 degrees, in particular more than 230 degrees, in the circumferential direction of the projection of the bore. This angle is the circumferential angle to the center point of the bore in circuit board 38.

Circuit board 38 has a planar configuration and includes epoxy resin.

It should be understood that the circuit board plane refers to the particular plane that circuit board 38 has at a vanishing circuit board thickness.

Connecting part 40 has a one-piece connection element 42, which includes threaded segment 43, connection section 39 and support section 37. Connection element 42 is provided in the form of a stamped-bent part, preferably a stamped-bent sheet metal part, and is preferably made from a metallic material. In other words, connection element 42 is an electrically conductive element.

Connection element 42 may be provided with a recess in which a threaded sleeve is accommodated by welding or soldering, in particular. The threaded sleeve has an internal thread for the connection to screw part 30.

Connecting part 40 includes a first spacer section 33, which separates housing part 32 from connection element 42. Spacer section 33 is arranged as an electrically insulating part, is preferably made from plastic and produced as a plastic injection-molded component, in particular. The plastic is preferably extruded onto connection element 42. Connecting part 40 is a composite component, preferably a composite component made from plastic and metal.

Spacer section 33 includes a recess through which screw part 30 is able to be guided. This recess is an uninterrupted recess and extends from threaded segment 43 to housing part 32. Spacer section 33 is preferably U-shaped, and a section of screw part 30, preferably a threaded segment, is situated between the legs of the U.

The distance between connection element 42 and housing part 32 is at least as large as the clearance between circuit board 38 fitted with components and housing part 32. In this manner, spacer section 33 improves the dielectric strength of the converter. The gap created by spacer section 33 between circuit board 38 fitted with components and housing part 32, i.e. the clearance, amounts to at least 5 mm, which corresponds to a breakdown voltage of at least 10 kV.

Figure 3:
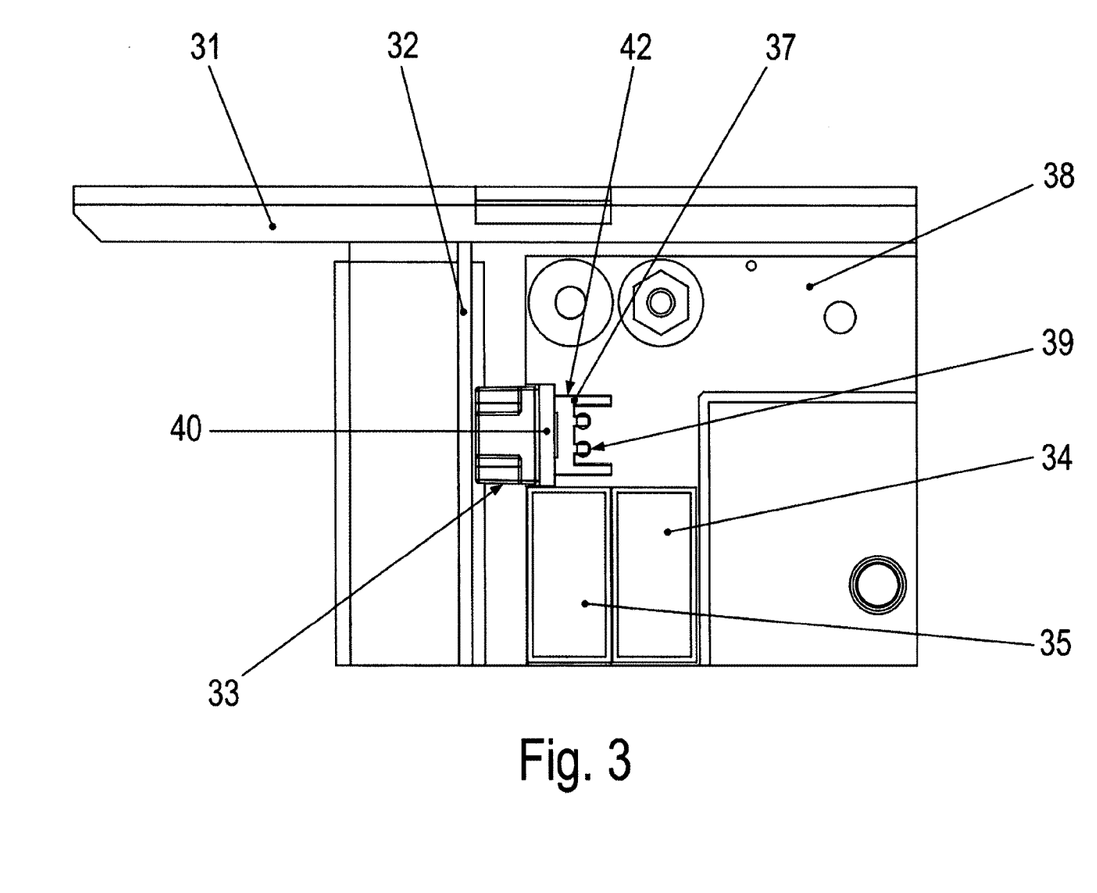
FIG. 3 shows a detail view of an electrical device according to an example embodiment of the present invention in a first variant, in a plan view.

FIG. 3 shows a detail view of the first variant of the converter.

In the first variant, just like in the second variant, connecting part 40 is inserted into circuit board 38. In the first variant, however, connection element 42 is situated in a manner that electrically insulates it from housing part 32. Spacer section 33 functions as an insulator. Spacer section 33 is preferably separated from housing part 32, and the clearance between spacer section 33 and housing part 32 amounts to less than 1 mm, and preferably less than 0.5 mm.

The converter thus includes no connection in the first variant, in particular a screw part 30, that connects housing part 32 and connecting part 40 to each other in an electrically conductive manner. The recess for screw part 30 acts as a ventilation hole for the converter.

Connecting part 40 may be connected to circuit board 30 via surface-mounting using SMD technology. For this purpose, support section 37 of connecting part 40 simultaneously functions as connection element 42.

LIST OF REFERENCE CHARACTERS

M motor
1 alternating voltage connection
2 inductor
3 inductor
4 inductor
5 rectifier
6 capacitor
7 center tap
8 inverter
9 ground connection
10 housing
11 capacitor
12 ground connection
13 capacitor
14 capacitor
15 capacitor
16 connection
17 ground connection
18 star point
19 capacitor
20 capacitor
30 screw part
31 housing part
32 housing part
33 spacer section
34 condenser
35 condenser
36 condenser
37 support section
38 circuit board
39 connection section
40 connecting part
41 perforated disk 42 connection element
43 threaded segment
44 recess

The invention claimed is:

1. An electrical device, comprising:
a circuit board;
a housing part; and
a connecting part inserted into and/or soldered to the circuit board, the connecting part including a spacer section and a connection element, the circuit board separated from the housing part by a spacer section, the connection element including a threaded segment, the connection element connected to at least one circuit trace on the circuit board in an electrically conductive manner;
wherein the connecting part is arranged as a composite component, the connection element is produced from an electrically conductive material and/or metal, and the spacer section is produced from an electrically insulating material and/or plastic.

2. The electrical device according to claim 1, wherein the spacer section is a plastic injection-molded part and/or is extrusion-coated onto the connection element, the connection element is at least partially covered by the spacer section, and/or the spacer section wraps around an edge and/or a sheet-metal edge of the connection element.

3. The electrical device according to claim 1, wherein electrical components are fitted into the circuit board, and the spacer section is arranged between the circuit board and the housing part such that the electrical components on the circuit board have a minimum clearance with respect to the housing part, the clearance being greater than 5 mm.

4. The electrical device according to claim 1, wherein the connection element includes at least one connection section and/or connection tab, at least one support section, and/or the threaded segment, and/or the connection element is arranged as one part, and/or the connection element is arranged as a stamped-bent part and/or as a stamped-bent sheet metal part.

5. The electrical device according to claim 1, wherein a connection section projects through a bore in the circuit board and is solder-connected to a circuit trace of the circuit board, and/or a perpendicular projection of the support section onto a circuit board plane surrounds a perpendicular projection of the bore onto the circuit board plane at an angle of more than 180 degrees and/or more than 230 degrees, in a circumferential direction of the projection of the bore, and/or the support section extends at a right angle to a normal vector of the circuit board plane of the circuit board.

6. The electrical device according to claim 1, wherein the housing part includes punched out recesses that extend through the housing part, and a screw part is guidable through one of the recesses and/or the threaded segment is aligned with the recess, the housing part and the connection element connectable together by the screw part in an electrically conductive manner, the housing part arranged as an earth connection.

7. The electrical device according to claim 1, wherein a screw part is guided through a recess in the housing part and screwed and/or self-locking screwed to the threaded segment, the screw part connecting the housing part and the connection element in an electrically conductive manner, the housing part arranged as an earth connection, and/or a perforated disk is arranged between a screw head of the screw part and the housing part.

8. An electrical device, comprising:
a circuit board;
a housing part; and
a connecting part inserted into and/or soldered to the circuit board, the connecting part including a spacer section and a connection element, the circuit board separated from the housing part by a spacer section, the connection element including a threaded segment, the connection element connected to at least one circuit trace on the circuit board in an electrically conductive manner;
wherein the spacer section include a recess, through which a screw part is guidable and/or guided, the recess extends through the spacer section, the spacer section is substantially U-shaped, and/or a region of the screw part is arrangeable and/or arranged between legs of the U-shaped spacer section.

9. An electrical device, comprising:
a circuit board;
a housing part; and
a connecting part inserted into and/or soldered to the circuit board, the connecting part including a spacer section and a connection element, the circuit board separated from the housing part by a spacer section, the connection element including a threaded segment, the connection element connected to at least one circuit trace on the circuit board in an electrically conductive manner;
wherein (a) first capacitors are inserted into the circuit board, the first capacitors having a common star point, the star point is connected to the connection element of the connecting part in an electrically conductive manner by circuit traces, and/or the start point is grounded by the connecting part and/or (b) first capacitors are inserted into the circuit board, the first capacitors having a shared star point, the star point connected to a fourth capacitor in an electrically conductive manner, the fourth capacitor connected to the connection element of the connecting part by at least one circuit trace of the circuit board, the fourth capacitor arranged electrically between the star point and the connecting part, a series connection is formed by the star point, the fourth capacitor, and the connecting part, and/or the fourth capacitor is grounded by the connecting part.

10. An electrical device, comprising:
a circuit board;
a housing part; and
a connecting part inserted into and/or soldered to the circuit board, the connecting part including a spacer section and a connection element, the circuit board separated from the housing part by a spacer section, the connection element including a threaded segment, the connection element connected to at least one circuit trace on the circuit board in an electrically conductive manner;
wherein second capacitors are inserted into the circuit board, the second capacitors form a series connection having a center tap, the center tap is connected to the star point in an electrically conductive manner, and/or the second capacitors are switched and arranged in parallel with a third capacitor in an intermediate circuit condenser.

11. An electrical device, comprising:
a circuit board;
a housing part;
a connecting part inserted into and/or soldered to the circuit board, the connecting part including a spacer section and a connection element, the circuit board separated from the housing part by a spacer section, the connection element including a threaded segment, the connection element connected to at least one circuit trace on the circuit board in an electrically conductive manner; and a multi-phase alternating-voltage terminal on an input side, which has a separate connection for each phase, wherein the alternating voltage terminal is adapted to supply a rectifier, a connection means being connected to a separate input pole of the rectifier by a phase line for each phase, each phase line having a tap, and a first capacitor is electrically provided between each tap and the star point.

12. An electrical device, comprising:
a circuit board;
a housing part;
a connecting part inserted into and/or soldered to the circuit board, the connecting part including a spacer section and a connection element, the circuit board separated from the housing part by a spacer section, the connection element including a threaded segment, the connection element connected to at least one circuit trace on the circuit board in an electrically conductive manner; and an inverter, a voltage DC link having a third capacitor arranged as an intermediate circuit condenser between a rectifier and the inverter, the inverter being suppliable from the third capacitor; and/or wherein a separate first inductor is arranged in each phase line between a connection and a tap for a first capacitor; and/or a separate second inductor is arranged in each phase line between the tap for the first capacitor and an input pole of the rectifier.

13. An electrical device, comprising:
a circuit board;
a housing part; and
a connecting part inserted into and/or soldered to the circuit board, the connecting part including a spacer section and a connection element, the circuit board separated from the housing part by a spacer section, the connection element including a threaded segment, the connection element connected to at least one circuit trace on the circuit board in an electrically conductive manner;

wherein the electrical device is arranged as a converter.

14. A method for producing an electrical device and/or an electrical device model series having at least two variants of electrical devices, comprising:

inserting at least one connecting part and condensers into a circuit board, the condensers have a shared star point, to which the connecting part is connected in an electrically conductive manner; and arranging the circuit board in a grounded housing having a housing part, the star point being electrically insulated from the grounded housing during production of a first variant.

15. The method according to claim 14, further comprising, for producing a second variant, connecting the star point to the grounded housing in an electrically conductive manner, including guiding a connector and/or a screw part through a recess in the housing part and connecting the connector and/or the screw part to the connecting part in a reversible manner.

16. The method according to claim 15, wherein the screw part is screwed into the connecting part, the screw part is connected to the grounded housing part in an electrically conductive manner, and/or the screw part touches the housing part.

17. The method according to claim 14, wherein the electrical device is arranged according to claim 1.

18. The method according to claim 14, wherein a first variant or a second variant of the electrical device is produced.

19. An electrical device, comprising:
a circuit board;
a housing part; and
a connecting part inserted into and/or soldered to the circuit board, the connecting part including a spacer section and a connection element, the circuit board separated from the housing part by a spacer section, the connection element including a threaded segment, the connection element connected to at least one circuit trace on the circuit board in an electrically conductive manner;

wherein (a) first capacitors are inserted into the circuit board, the first capacitors having a common star point, the star point is connected to the connection element of the connecting part in an electrically conductive manner by circuit traces, and/or (b) the star point is connected to a fourth capacitor in an electrically conductive manner, the fourth capacitor connected to the connection element of the connecting part by at least one circuit trace of the circuit board, the fourth capacitor arranged electrically between the star point and the connecting part, a series connection is formed by the star point, the fourth capacitor, and the connecting part.

* * * * *